(12) United States Patent
Mizutani

(10) Patent No.: US 9,841,589 B2
(45) Date of Patent: Dec. 12, 2017

(54) ILLUMINATION OPTICAL APPARATUS AND DEVICE MANUFACTURING METHOD

(71) Applicant: CANON KABUSHIKI KAISHA, Tokyo (JP)

(72) Inventor: Masaki Mizutani, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/084,949

(22) Filed: Mar. 30, 2016

(65) Prior Publication Data
US 2016/0299437 A1    Oct. 13, 2016

(30) Foreign Application Priority Data

Apr. 8, 2015    (JP) ................. 2015-078857

(51) Int. Cl.
| | | |
|---|---|---|
| *G03B 27/52* | (2006.01) | |
| *G03B 27/42* | (2006.01) | |
| *G02B 19/00* | (2006.01) | |
| *G03F 7/20* | (2006.01) | |

(52) U.S. Cl.
CPC ..... *G02B 19/0047* (2013.01); *G02B 19/0028* (2013.01); *G03F 7/70075* (2013.01); *G03F 7/70191* (2013.01)

(58) Field of Classification Search
CPC .. G03F 7/70483; G03F 7/705; G03F 7/70625; G03F 1/70; G03F 7/70125; G03F 7/70516; G03F 7/70616; G03F 1/36; G03F 7/70508; G03F 7/70091; G03F 7/70283; G03F 1/38; G03F 7/0002; G03F 7/70558; G03F 1/26; G03F 1/72; G03F 7/70075; G03F 9/7019; G03F 7/70191; G03F 7/70108; G03F 7/20; G03F 7/70308;
(Continued)

(56) References Cited

U.S. PATENT DOCUMENTS

| | | |
|---|---|---|
| 6,281,967 B1 | 8/2001 | Kudo |
| 2008/0291422 A1 | 11/2008 | Kremer |

FOREIGN PATENT DOCUMENTS

| | | |
|---|---|---|
| JP | 2000269114 A | 9/2000 |
| TW | 200518187 A | 6/2005 |

OTHER PUBLICATIONS

Office Action issued in Taiwanese Patent Application No. 105107917 dated Jun. 21, 2017. English translation provided.

*Primary Examiner* — Mesfin Asfaw
(74) *Attorney, Agent, or Firm* — Rossi, Kimms & McDowell LLP

(57) ABSTRACT

Provided is an illumination optical apparatus that illuminates the surface with light from a light source and includes an optical integrator (the integrator) configured to form a plurality of secondary source images (the images); a adjuster having a plurality of adjusting elements for adjusting a light of the images; and a consensor configured such that the adjuster is in a conjugate relationship with the end surface of the integrator, wherein the element is located at positions, which corresponds to a secondary source formed by an odd reflection times in the first direction by the integrator and a secondary source formed by an even times and a secondary source formed by an odd times in the second direction and a secondary source formed by an even times, wherein the element is not located at a position which corresponds to a secondary source formed by no reflection in the integrator.

9 Claims, 11 Drawing Sheets

(58) Field of Classification Search
CPC . G03F 1/32; G03F 1/58; G03F 7/2008; G03F 7/70; G03F 7/70066
See application file for complete search history.

ILLUMINATION OPTICAL APPARATUS AND DEVICE MANUFACTURING METHOD

BACKGROUND OF THE INVENTION

Field of the Invention

The present invention relates to an illumination optical apparatus and a device manufacturing method.

Description of the Related Art

Projection exposure apparatuses for manufacturing devices such as semiconductor devices or the like transfer a pattern formed on an original (mask, reticle or the like) onto a substrate (a wafer or the like where the surface thereof is coated with a resist layer) via an image formation optical system, a projection optical system, or the like. An exposure apparatus includes an illumination optical apparatus that illuminates an original with a beam of light from a light source. If illumination light emitting from an illumination optical apparatus to an original is not uniform or the telecentricity (the parallelism of the optical axis and principal rays) is lost, pattern transfer to a substrate becomes insufficient, so that the exposure apparatus cannot provide high quality devices. Thus, in order to form micro patterns on a substrate, illuminance uniformity on a surface to be illuminated such as a mask plane (reticle plane), a wafer plane, or the like needs to be improved. Hence, illumination optical apparatuses each provided with a rod-type optical integrator are known as a method for improving illuminance uniformity.

With the use of the above rod-type optical integrator, illumination light, illumination light emitted from the secondary light source, which has been formed corresponding to the number of times of internal reflections within the rod, is superimposed at the light-emitting end of the rod, so that the light intensity distribution at the light-emitting end surface of the rod can be uniformed. However, in the above-described illumination optical apparatus, the non-uniformity of the illuminance distribution on the surface to be illuminated may be observed due to various factors such as contamination of an optical system, eccentricity, unevenness of antireflective coating, or the like.

Accordingly, as a method for adjusting an illuminance distribution on a surface to be illuminated, an illumination optical apparatus as shown in Japanese Patent Laid-Open No. 2000-269114 is disclosed. The illumination optical apparatus disclosed in Japanese Patent Laid-Open No. 2000-269114 is provided such that the light amount controlling unit having a plurality of filter patterns which are provided in correspondence with secondary light source images is provided at a position on the incidence side of the rod-type optical integrator which is in an optically conjugated relationship with the light-emitting end surface of the rod-type optical integrator. In this manner, the state of light supplied from the secondary light source images to the surface to be illuminated is controlled, so that the illuminance distribution on the surface to be illuminated can be adjusted to a desired state.

However, in the illumination optical apparatus disclosed in Japanese Patent Laid-Open No. 2000-269114, if an arbitrary selection is made on positions at which filter patterns are disposed, the illuminance distribution on the surface to be illuminated may be non-uniform in the case where an attachment position error of the light amount controlling unit or a manufacturing position error of the filter pattern occurs. Furthermore, the telecentricity of illumination light for illuminating the surface to be illuminated may undesirably change.

SUMMARY OF THE INVENTION

The present invention provides an illumination optical apparatus that realizes a desired illuminance distribution on a surface to be illuminated even if an attachment position error of the light amount controlling unit or a manufacturing position error of the filter pattern is present.

According to an aspect of the present invention, an illumination optical apparatus for illuminating the surface to be illuminated with light from a light source is provided that includes an optical integrator configured to form a plurality of secondary light source images by causing the incident light to be reflected multiple times at the inner surface thereof; a light amount adjuster configured to have a plurality of light amount adjusting elements for adjusting a light amount of the secondary light source image; and a condenser optical system configured such that the light amount adjuster is in a conjugate relationship with the light-emitting end surface of the optical integrator, wherein the light amount adjusting element is located at positions, which correspond to a secondary light source which is formed by an odd number of times of reflections in the first direction by the optical integrator and a secondary light source which is formed by an even number of times of reflections in the first direction by the optical integrator and a secondary light source which is formed by an odd number of times of reflections in the second direction different from the first direction by the optical integrator and a secondary light source which is formed by an even number of times of reflections in the second direction by the optical integrator, wherein the light amount adjusting element is not located at a position which corresponds to the secondary light source which is formed by no reflection, in the optical integrator.

Further features of the present invention will become apparent from the following description of exemplary embodiments with reference to the attached drawings.

DESCRIPTION OF THE EMBODIMENTS

Hereinafter, preferred embodiments of the present invention will be described with reference to the attached drawings.

Figure 1:
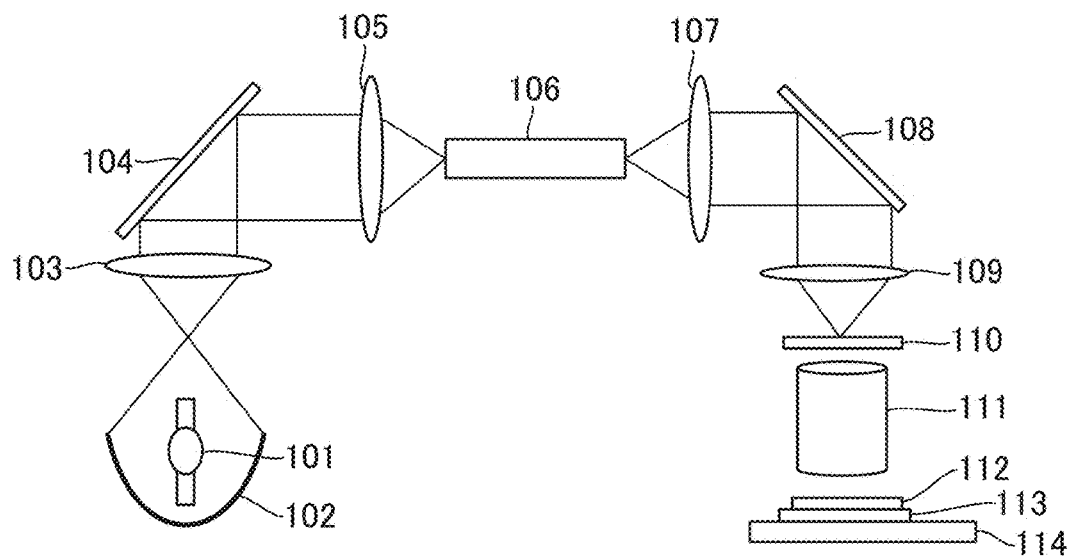
FIG. 1 is a diagram depicting a schematic illustration of an exposure apparatus.

First, a schematic view of an exposure apparatus is shown in FIG. 1. A light source 101 is an ultra-high pressure mercury lamp or the like which is positioned at about the first focal point of an elliptical mirror (focusing unit) 102. Next, the light reflected from the elliptical mirror 102 is reflected by a reflecting mirror 104 through a condensor optical system 103. Then, the light reflected from the reflecting mirror 104 is guided to a rod-type optical integrator 106 through a condensor optical system 105. A beam of light from the secondary light source, which is in correspondence with the number of times of reflections formed by multiple reflections within the rod-type optical integrator 106, is reflected by a reflecting mirror 108 through a condensor optical system 107. Then, the beam of light reflected from the reflecting mirror 108 is illuminated onto a surface to be illuminated (mask/reticle plane) 110 through a condensor system 109. In this manner, the illumination area on the surface to be illuminated 110 is illuminated with superimposedly and substantially uniform illuminance by the secondary light source.

Next, the light illuminated onto the surface to be illuminated 110 passes through a projection optical system 111 that projects the pattern on the surface to be illuminated 110, and projects and exposes a substrate 112 held by a substrate holding chuck 113 on a substrate stage 114 for positioning of a substrate. As described above, the illumination area on the surface to be illuminated 110 is uniformly illuminated, so that the micro patterns on the surface to be illuminated 110 can be transferred onto the substrate 112.

Figure 2:
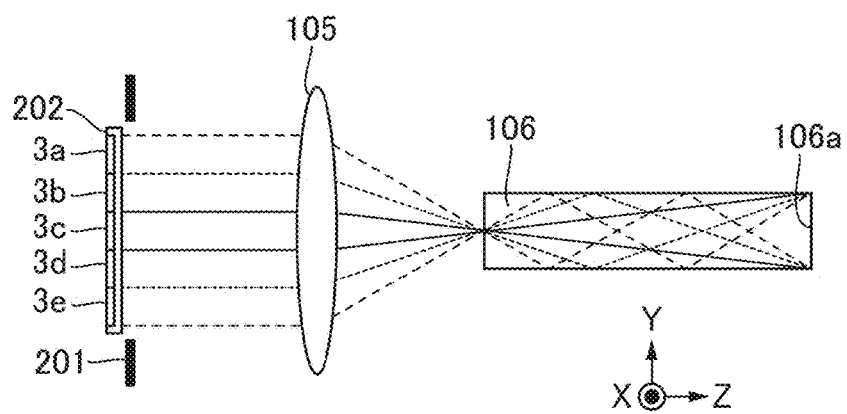
FIG. 2 is a diagram illustrating an illumination optical apparatus.

Next, FIG. 2 is a diagram illustrating an illumination optical apparatus. FIG. 2 illustrates the light focusing optical system 105, an optical filter 202, and the rod-type optical integrator 106. First, a filter pattern 3c disposed on the optical filter 202 (light amount adjuster) along the optical axis controls the intensity distribution of a beam of light, which is not reflected from the inner surfaces of the rod-type optical integrator 106, from the secondary light source. In FIG. 2, the Z axis is defined as the direction along the optical axis direction, the Y axis is defined as the direction parallel to the plane of the drawing sheet and perpendicular to the Z axis, and the X axis is defined as the direction vertical to the plane of the drawing sheet.

Next, a pair of filter patterns 3b and 3d adjacent to opposing sides of the filter pattern 3c controls the intensity distribution of a beam of light, which has been reflected a single time from the inner surfaces of the rod-type optical integrator 106, from the secondary light source. A pair of filter patterns 3a and 3e adjacent to opposing sides of the filter patterns 3b and 3d controls the intensity distribution of a beam of light, which has been reflected two times from the inner surfaces of the rod-type optical integrator 106, from the secondary light source. With the aid of the above configuration, the transmittance of each of a plurality of beams of light from the secondary light source formed by the rod-type optical integrator 106 can be independently controlled.

The filter patterns 3a, 3b, 3c, 3d, and 3e are disposed near a plane 201 which is conjugated to the light-emitting end surface 106a of the rod-type optical integrator 106. The magnification provided by the light focusing optical system 105 is determined by the ratio of the size of the light-emitting end surface 106a of the rod-type optical integrator 106 to the size of the filter patterns 3a, 3b, 3c, 3d, and 3e. The shape of one filter pattern corresponds to the illumination area at the light-emitting end surface 106a of the rod-type optical integrator 106, and the transmittance distribution of each of the filter patterns 3a to 3e is reflected in the illuminance distribution on the surface to be illuminated 110.

Figure 3:
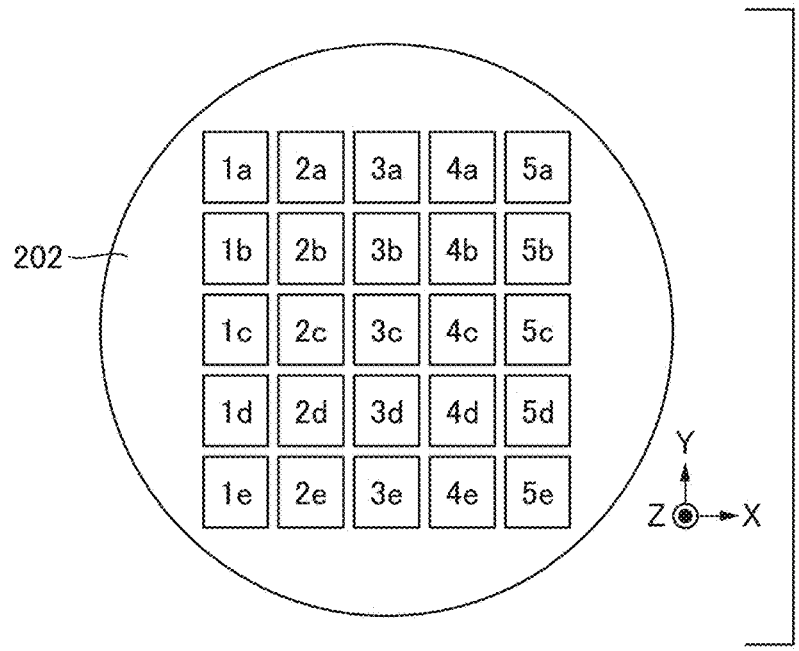
FIG. 3 is a diagram illustrating optical filters as viewed from the front (the optical axis direction).

Next, FIG. 3 is a diagram illustrating the optical filter 202 as viewed from the Z direction (the optical axis direction). Each of the filter patterns 1a to 5e is an area corresponding to the number of times of internal reflections in the secondary light source formed by the rod-type optical integrator 106. FIG. 3 shows the case where the number of times of internal reflections within the rod-type optical integrator 106 is two. Thus, when the number of times of internal reflections within the rod-type optical integrator 106 is three or greater, the number of filter patterns may increase depending on the number of times of internal reflections.

Figure 4A:
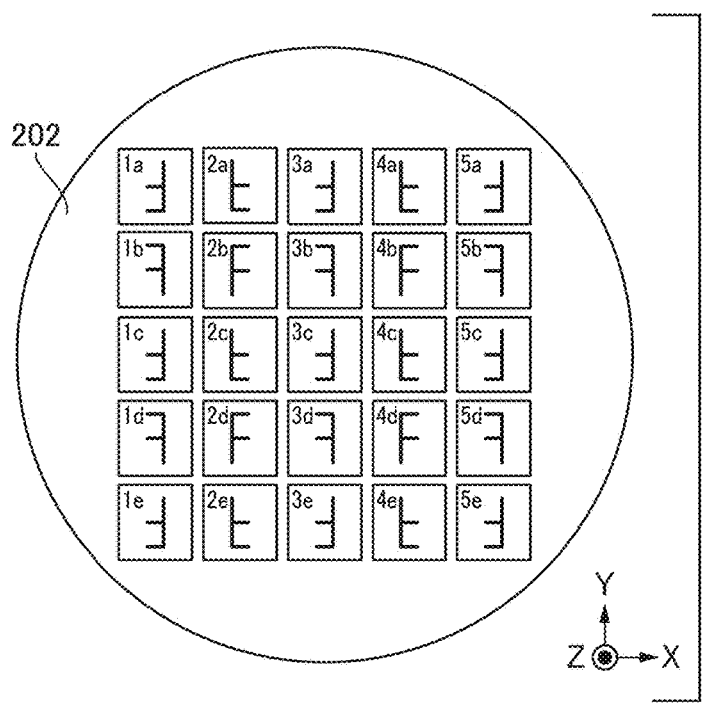
FIG. 4A is a diagram illustrating the image of each filter pattern in an optical filter.
Figure 4B:
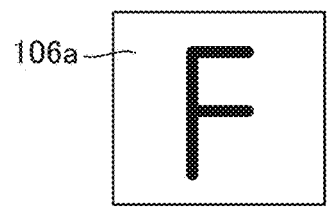
FIG. 4B is a diagram illustrating an image of a filter pattern at the rod-type optical integrator light-emitting end surface.

Next, FIGS. 4A and 4B are diagrams illustrating the relationship between the image of each filter pattern in the optical filter 202 and the light-emitting end surface 106a of the rod-type optical integrator 106. An image is represented by character of "F". The orientation of the image of each filter pattern in the optical filter 202 depends on the number of times of reflections within the rod-type optical integrator 106, the image of the filter pattern corresponding to an odd number of times of reflections and the image of the filter pattern corresponding to an even number of times of reflections are mirror images of each other. In other words, since two adjacent beams of light from the secondary light source are inverted in the rod-type optical integrator 106, the images of two adjacent filter patterns in the optical filter 202 are mirror images of each other.

As described above, the intensity distribution of the beam of light from the secondary light source is controlled with use of the filter patterns (light amount adjusting elements) in the optical filter 202, so that the illuminance distribution on the surface to be illuminated 110 can be adjusted. However, the following problem remains if an arbitrary selection is made on positions at which filter patterns are disposed. Here, a description will be given of an exemplary problem with reference to FIGS. 5A and 5B. FIG. 5B is a diagram illustrating a form where the ideal illuminance correcting effect of the image on the light-emitting end surface 106a of the rod-type optical integrator 106 cannot be obtained due to the affection caused by an attachment error of the optical filter 202.

Figure 5A:
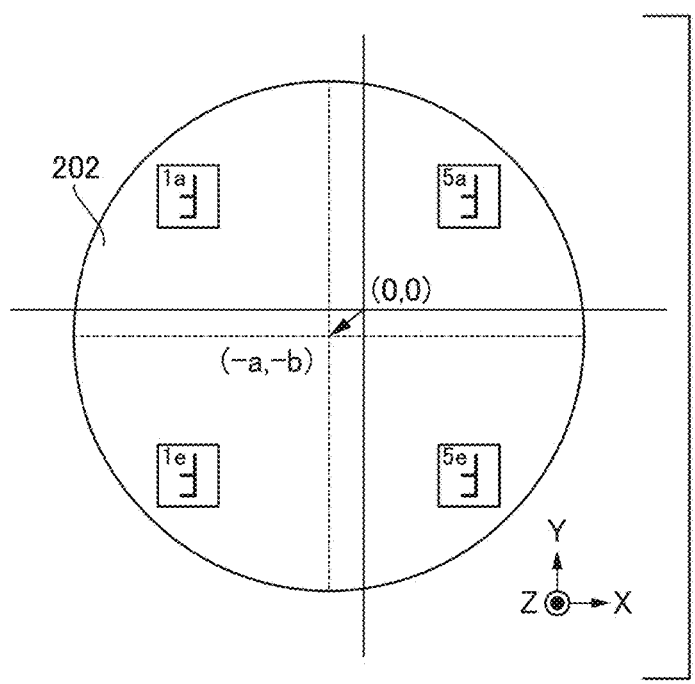
FIG. 5A is a diagram illustrating a state where an attachment error of an optical filter occurs.
Figure 5B:
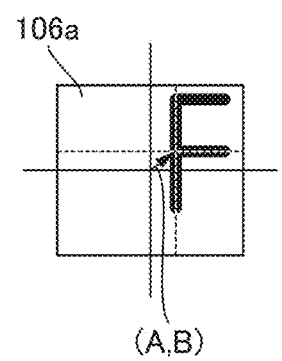
FIG. 5B is a diagram illustrating an image of a filter pattern at the rod-type optical integrator light-emitting end surface in a state where an attachment error of an optical filter occurs.

FIG. 5A is a diagram illustrating a state where an attachment error of an optical filter occurs, wherein the intersection of solid lines indicates the center of the optical axis and the intersection of broken lines indicates the center position of attachment of the optical filter 202. In the present embodiment, the center position of attachment of the optical filter 202 is displaced (−a, −b) from the center of the optical axis (X, Y)=(0, 0). In the form shown in FIG. 5A, the filter patterns 1a, 1e, 5a, and 5e are provided in the optical filter 202.

The filter patterns 1a, 1e, 5a, and 5e are provided at positions corresponding to the secondary light sources where the number of times of reflections within the rod-type optical integrator 106 in the X axis direction (first direction) is two times and the number of times of reflections within the rod-type optical integrator 106 in the Y axis direction (second direction) is two times. As described above, the orientation of each filter pattern in the optical filter 202 is determined whether the number of times of reflections within the rod-type optical integrator 106 is an odd number of times or an even number of times. Thus, the filter patterns 1a, 1e, 5a, and 5e are oriented in the same direction.

FIG. 5B is a diagram illustrating an image on the light-emitting end surface 106a of the rod-type optical integrator 106 to be formed by the filter patterns 1a, 1e, 5a, and 5e. Each filter pattern is in an optically conjugated relationship with the light-emitting end surface 106a of the rod-type optical integrator 106. Thus, if the center of the optical filter 202 is displaced from the center of the optical axis, the image on the light-emitting end surface 106a of the rod-type optical integrator 106 is displaced by an amount (A, B) obtained by magnifying the attachment error of the optical filter 202 by the magnification obtained by the light focusing optical system 105. Thus, a desired illuminance distribution cannot be obtained on the surface to be illuminated 110.

Here, the symbol "A" shown in FIG. 5B is an amount obtained by magnifying the amount of misalignment "−a" between the center position of attachment of the optical filter 202 and the optical axis in the X axis direction by the magnification obtained by the light focusing optical system 105. The symbol "B" shown in FIG. 5B is an amount obtained by magnifying the amount of misalignment "−b" between the center position of attachment of the optical filter 202 and the optical axis in the Y axis direction by the magnification obtained by the light focusing optical system 105. In other words, the relationship of A=−a×magnification and B=−b×magnification is met.

Figure 6:
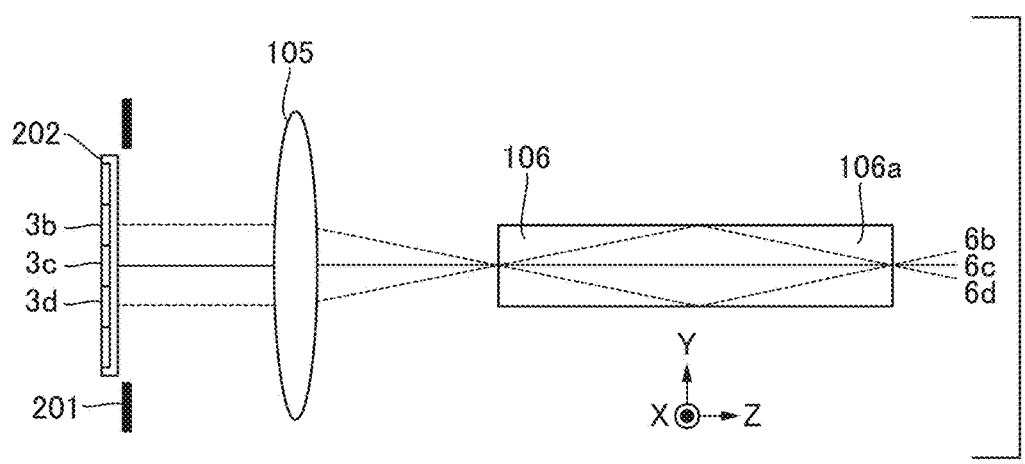
FIG. 6 is a diagram illustrating light rays passing through the centers of the filter patterns of a light amount adjuster in parallel to the optical axis.

Next, a description will be given of an example of other problems with reference to FIG. 6, FIG. 7, and FIG. 8. First, FIG. 6 is a diagram illustrating the light focusing optical system 105, the optical filter 202, and the rod-type optical integrator 106. FIG. 6 is also a diagram illustrating light rays passing through the centers of the filter patterns in the optical filter 202 in parallel to the optical axis. Light rays passing through the centers of the filter patterns 3b, 3c, and 3d in the optical filter 202 in parallel to the optical axis are defined as 6b, 6c, and 6d, respectively.

Next, the filter patterns in the optical filter 202 correspond to the secondary light sources such that the number of times of reflections within the rod-type optical integrator 106 increases towards the outer filter pattern. In other words, the light rays 6b and 6d which have reflected a single time within the optical integrator 106 exit at a greater angle to the optical axis than the light ray 6c which has no reflection within the optical integrator 106 at the light-emitting end surface 106a of the rod-type optical integrator 106. As shown in FIG. 6, telecentricity does not change if the filter patterns 3b, 3c, and 3d are provided.

Figure 7:
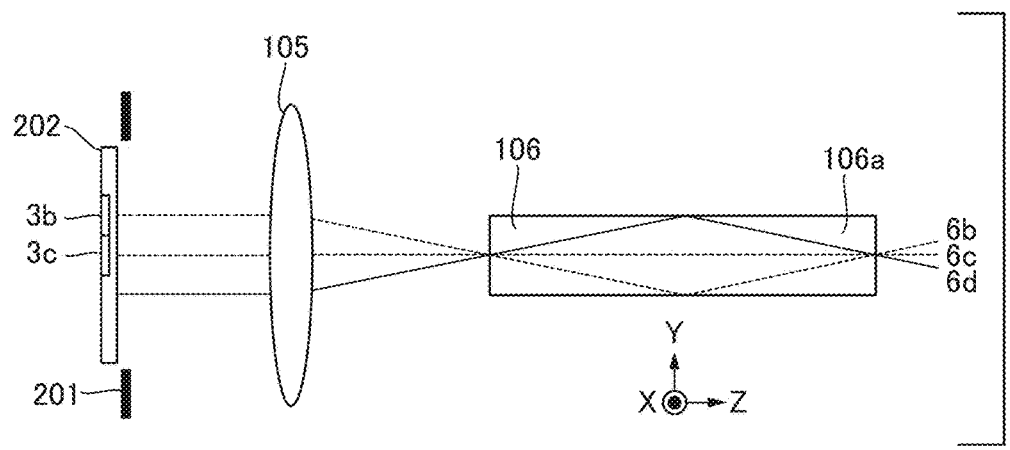
FIG. 7 is a diagram illustrating a state in which the telecentricity on the rod exit surface is displaced to the negative side.

Next, FIG. 7 is a diagram illustrating a state where a light amount adjuster is provided in the secondary light source areas 3b and 3c in the optical filter 202. In this case, the amount of light transmitting through 6b and 6c decreases, so that the intensity of light having an angle from 6b to 6c decreases at the light-emitting end surface 106a of the rod-type optical integrator 106. In other words, the center of gravity of the amount of light in the angular distribution is displaced in the negative direction relative to the optical axis, resulting in a change in telecentricity.

Figure 8:
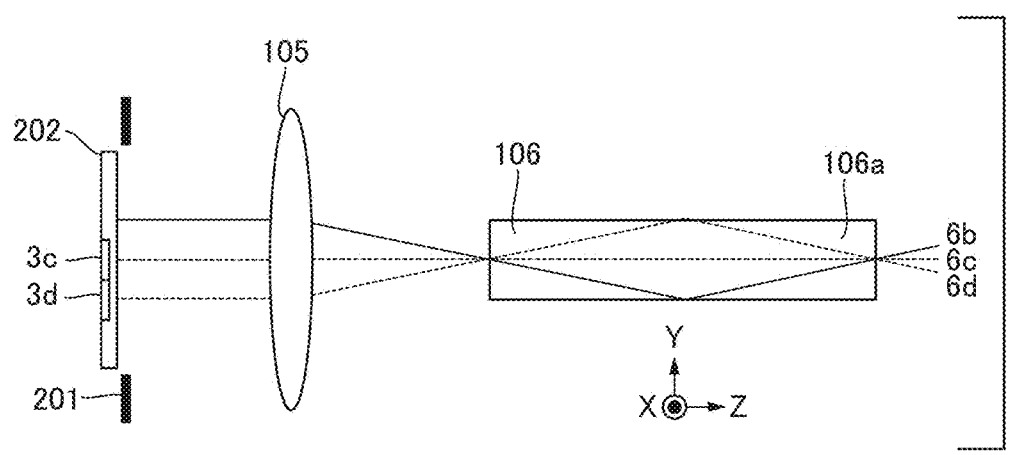
FIG. 8 is a diagram illustrating a state in which the telecentricity on the rod exit surface is displaced to the positive side.

Next, FIG. 8 is a diagram illustrating a state where a light amount adjuster is provided in the secondary light source areas 3c and 3d in the optical filter 202. In this case, the amount of light transmitting through 6c and 6d decreases, so that the intensity of light having an angle from 6c to 6d decreases at the light-emitting end surface 106a of the rod-type optical integrator 106. In other words, the center of gravity of the amount of light in the angular distribution is displaced in the positive direction relative to the optical axis, resulting in a change in telecentricity. As described above, if an arbitrary selection is made on positions at which filter patterns are disposed, the center of gravity of the amount of light in the angular distribution at the surface to be illuminated 110 changes, resulting in a change in telecentricity.

First Embodiment

Figure 9A:
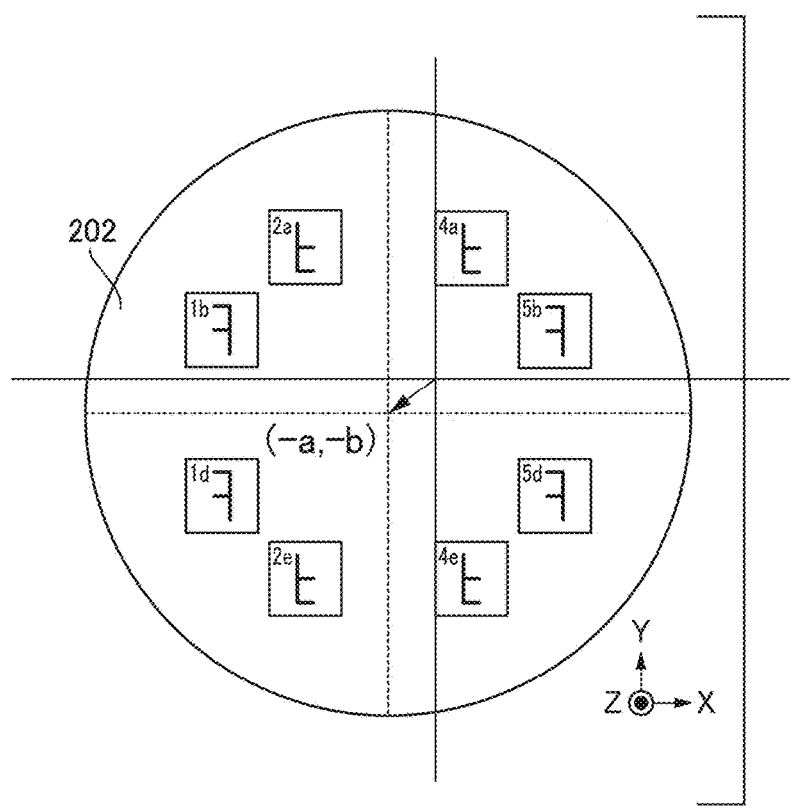
FIG. 9A is a diagram illustrating optical filters in a first embodiment.

FIG. 9A is a diagram illustrating the optical filter 202 in the present embodiment. Here, a description will be given of the effect of reducing the affection caused by an attachment error of the optical filter 202 according to the present embodiment with reference to FIGS. 9A to 9D. While, in the present embodiment, the filter patterns are provided at positions of 1*b*, 1*d*, 2*a*, 2*e*, 4*a*, 4*e*, 5*b*, and 5*d* in the optical filter 202, the arrangement of the filter patterns is not limited thereto.

The image on the light-emitting end surface 106*a* of the rod-type optical integrator 106 to be formed by the filter patterns 1*b*, 1*d*, 5*b*, and 5*d* is obtained by the fact that the number of times of reflections within the rod-type optical integrator 106 in the X axis direction is two times and the number of times of reflections within the rod-type optical integrator 106 in the Y axis direction is one time. Thus, the orientation of the filter patterns is in an inverted relationship with the orientation of the image on the light-emitting end surface 106*a* of the rod-type optical integrator 106 in the X axis direction.

The image on the light-emitting end surface 106*a* of the rod-type optical integrator 106 to be formed by the filter patterns 2*a*, 2*e*, 4*a*, and 4*e* is obtained by the fact that the number of times of reflections within the rod-type optical integrator 106 in the X axis direction is one time and the number of times of reflections within the rod-type optical integrator 106 in the Y axis direction is two times. Thus, the orientation of the filter patterns is in an inverted relationship with the orientation of the image on the light-emitting end surface 106*a* of the rod-type optical integrator 106 in the Y axis direction.

Figure 9B:
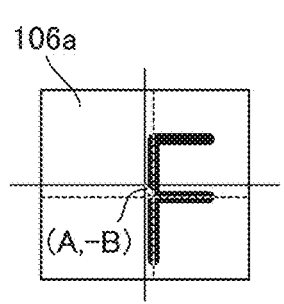
FIG. 9B is a diagram illustrating an image of a filter pattern at the rod-type optical integrator light-emitting end surface formed by a filter pattern.

Thus, the orientation of the filter patterns 1*b*, 1*d*, 5*b*, and 5*d* and the orientation of the filter patterns 2*a*, 2*e*, 4*a*, and 4*e* are in an inverted relationship in both X and Y directions. Next, consider the case where the attachment position of the optical filter 202 is displaced (−a, −b) from the center of the optical axis. FIG. 9B is a diagram illustrating the image on the light-emitting end surface 106*a* of the rod-type optical integrator 106 to be formed by the filter patterns 1*b*, 1*d*, 5*b*, and 5*d*. The orientation of these filter patterns is in an inverted relationship with the orientation of the image on the light-emitting end surface 106*a* of the rod-type optical integrator 106 in the X axis direction. Thus, the position of the image on the light-emitting end surface 106*a* of the rod-type optical integrator 106 becomes (A, −B) because it is reversely displaced in the X axis direction from the attachment error of the optical filter 202.

Figure 9C:
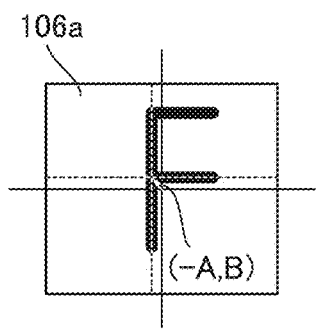
FIG. 9C is a diagram illustrating an image of a filter pattern at the rod-type optical integrator light-emitting end surface formed by a filter pattern.

Next, FIG. 9C is a diagram illustrating the image on the light-emitting end surface 106*a* of the rod-type optical integrator 106 to be formed by the filter patterns 2*a*, 2*e*, 4*a*, and 4*e*. The orientation of these filter patterns is in an inverted relationship with the orientation of the image on the light-emitting end surface 106*a* of the rod-type optical integrator 106 in the Y axis direction. Thus, the position of the image on the light-emitting end surface 106*a* of the rod-type optical integrator 106 becomes (−A, B) because it is reversely displaced in the Y axis direction from the attachment error of the optical filter 202.

Figure 9D:
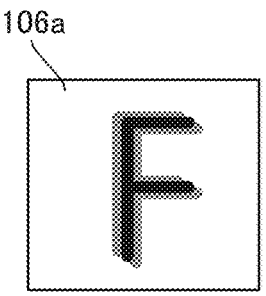
FIG. 9D is a diagram illustrating an image of a filter pattern at the rod-type optical integrator light-emitting end surface formed by a filter pattern.

FIG. 9D is a diagram illustrating the image on the light-emitting end surface 106*a* of the rod-type optical integrator 106 to be formed by the present embodiment, which is provided as a composite image of FIG. 9B and FIG. 9C. If the attachment position of the optical filter 202 is displaced from the optical axis, the image formed by the filter patterns 1*b*, 1*d*, 5*b*, and 5*d* and the image formed by the filter patterns 2*a*, 2*e*, 4*a*, and 4*e* are displaced from each other in different directions. Thus, the center position of the composite image is not displaced although its contour portion is slightly blurred.

As described above, the filter patterns include both the filter patterns of which the number of times of reflections within the rod-type optical integrator 106 in the X axis direction are an odd number of times and an even number of times and both the filter patterns of which the number of times of reflections within the rod-type optical integrator 106 in the Y axis direction are an odd number of times and an even number of times. In this manner, the affection caused by the position error of the image on the surface to be illuminated 110 due to the attachment position of the optical filter 202 can be reduced. Thus, according to the present embodiment, the attachment position accuracy of the optical filter 202 can be relieved, which can eliminate the necessity of a mechanism required for fine adjustment such as an attachment adjustment mechanism.

While, in the present embodiment, a description has been given of the case where the attachment position of the optical filter 202 is displaced from the optical axis, the same effect can be expected even if the filter patterns in the optical filter 202 deviate from their design values from each other. In other words, according to the embodiment of the present invention, a manufacturing position error upon forming the filter patterns provided in the optical filter 202 can be relieved.

Next, a description will be given of the effect of providing no change in telecentricity of illumination light for illuminating the surface to be illuminated according to the present embodiment. In the present embodiment, as shown in FIG. 9A, the combinations of the filter patterns 1*b*-5*d*, 1*d*-5*b*, 2*a*-4*e*, and 2*e*-4*a* are respectively disposed at positions so as to be in point symmetry relationship with respect to the optical axis and with each other.

Figure 10:
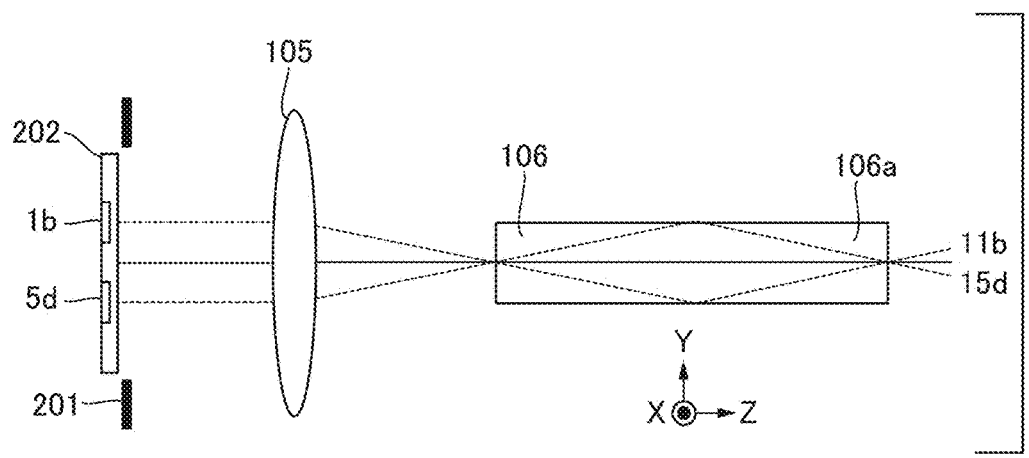
FIG. 10 is a diagram illustrating light rays passing through the centers of the filter patterns of a light amount adjuster in parallel to the optical axis.

FIG. 10 is a diagram illustrating light rays passing through the centers of the filter patterns 1*b* and 5*d* in parallel to the optical axis, which is taken along the Y-Z plane. Light rays passing through the centers of the filter patterns 1*b* and 5*d* in the optical filter 202 in parallel to the optical axis are defined as 11*b* and 15*d*, respectively. In the present embodiment, the light intensity of the light rays 11*b* and 15*d* decreases due to provision of the filter patterns at positions 1*b* and 5*d*, but the center of gravity of the amount of light in the angular distribution at the light-emitting end surface 106*a* of the rod-type optical integrator 106 does not change, resulting in no change in telecentricity.

In other words, the filter patterns are disposed at positions so as to be in point symmetry relationship with respect to the center of the optical filter 202, resulting in no change in the center of gravity of the amount of light in the angular distribution at the light-emitting end surface 106*a* of the rod-type optical integrator 106. In this manner, the center of gravity of the amount of light in the angular distribution at the surface to be illuminated 110 does not change, so that a change in telecentricity can be prevented from occurring.

Next, a description will be given of the case where a filter pattern is disposed at a position 3C in the optical filter 202. As shown in FIG. 4A, the filter pattern 3*c* is the center of the optical filter 202. Thus, the beam of light passing through the filter pattern 3*c* is the beam of light of which the internal reflection does not occur within the rod-type optical integrator 106, which is a mirror-image pattern of the light-emitting end surface 106*a* of the rod-type optical integrator 106. In other words, when a filter pattern is disposed at a position 3C in the optical filter 202, it is preferable that the filter patterns be provided at mirror-image positions such as 2*b*, 2*d*, 4*b*, and 4*d* in order to reduce the affection caused by an attachment position error of the optical filter 202.

However, as described above, all the filter patterns 2*b*, 2*d*, 4*b*, and 4*d* are not located at positions of point symmetry with respect to the filter pattern 3*c* and the optical axis. Thus, when a filter pattern is provided at any position of the filter patterns 3c, 2b, 2d, 4b, and 4d, the telecentricity on the light-emitting end surface 106a of the rod-type optical integrator 106 undesirably changes.

Thus, according to the present embodiment, no filter pattern is disposed at a position of 3c in the optical filter 202, so that the affection caused by an attachment position error of the optical filter 202 can be reduced without changing the telecentricity on the light-emitting end surface 106a of the optical integrator 106. In the present embodiment, a description has been given of the case where the number of filter patterns from which the number of times of reflections within the rod-type optical integrator 106 is an odd number of times is the same as the number of filter patterns from which the number of times of reflections within the rod-type optical integrator 106 is an even number of times. However, these numbers of filter patterns are not necessarily the same as each other due to a permissible value of positional shift in the image on the surface to be illuminated 110.

When the illuminance distribution in the optical filter 202 is not uniform, the intensity of light passing through the filter pattern 1d may differ from that passing through the filter pattern 5b. In this case, the amount of light to be shielded may vary even if the filter patterns are disposed as positions of point symmetry with respect to the center of the optical filter 202, and thus it is contemplated that the telecentricity on the light-emitting end surface 106a of the rod-type optical integrator 106 may change. In this case, for example, it is also contemplated that an adjustment is made not to cause any change in telecentricity on the light-emitting end surface 106a of the rod-type optical integrator 106 by changing the light transmittance of the light-shielding members of the light amount adjusters provided in the filter patterns 1d and 5b.

Second Embodiment

Figure 11A:
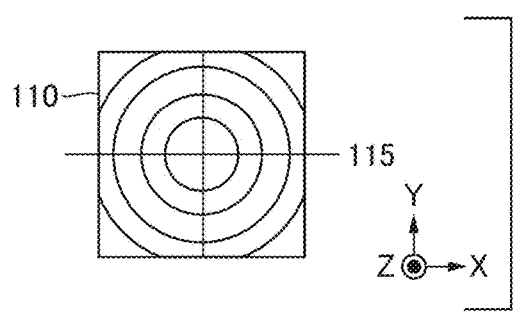
FIG. 11A is a diagram illustrating an illuminance distribution on the surface to be illuminated.
Figure 11B:
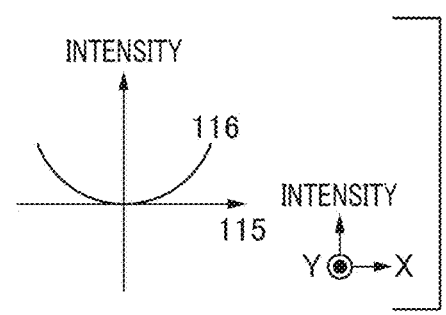
FIG. 11B is a diagram illustrating cross sectional illuminance of an illuminance distribution on the surface to be illuminated.

Next, a description will be given of an embodiment in which illuminance non-uniformity is corrected at the illumination area on the surface to be illuminated 110. First, FIG. 11A is a diagram illustrating an illuminance distribution at the illumination area on the surface to be illuminated 110. The illuminance distribution is the lowest at the central portion of the surface to be illuminated 110 but gradually increases as it comes closer to the periphery of the surface to be illuminated 110. Next, FIG. 11B shows an X cross-sectional illuminance 116 of an illuminance distribution on the surface to be illuminated 110, which shows the illuminance distribution at the X cross-section 115 shown in FIG. 11A. Since the illuminance distribution on the surface to be illuminated 110 gradually increases as it comes closer to the periphery thereof, it is assumed that the illuminance distribution has a cross-sectional shape such as a secondary shape depending on the X-coordinate.

Figure 12:
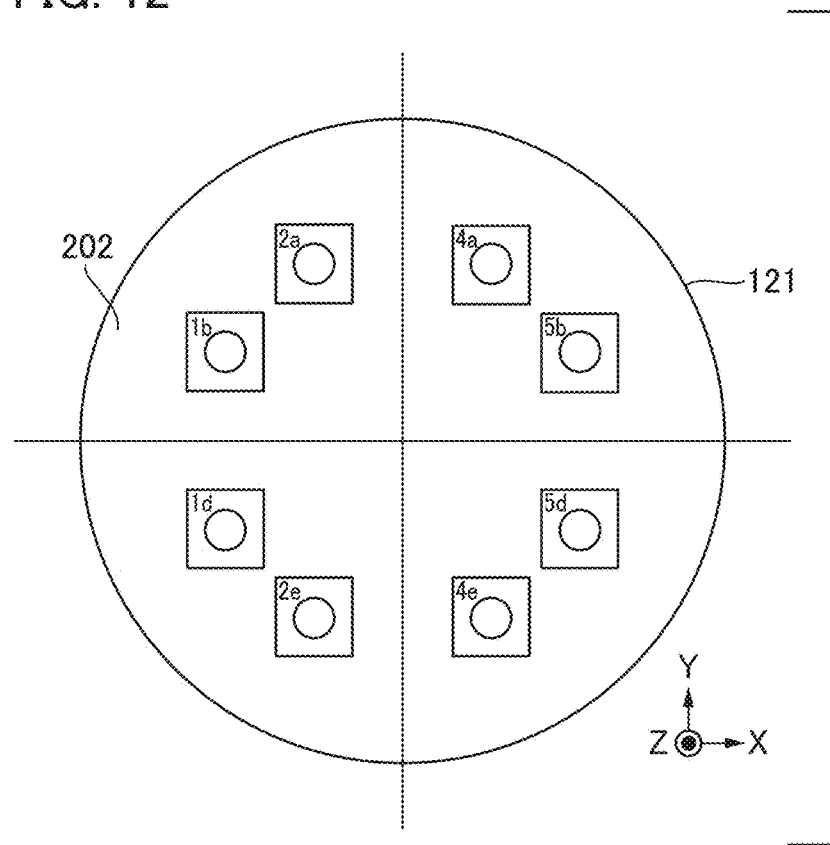
FIG. 12 is a diagram illustrating optical filters as viewed from the front (the optical axis direction).

Next, FIG. 12 is a diagram illustrating optical filters as viewed from the front (the optical axis direction). Each of the filter patterns is provided with a circular shape pattern and is provided with a light-shielding member outside of the circle. The optical filter provided with such filter patterns is defined as 121. While, in the present embodiment, the filter patterns are provided at positions of 1b, 1d, 2a, 2e, 4a, 4e, 5b, and 5d in the optical filter 202, the arrangement of the filter patterns is not limited thereto.

Figure 13:
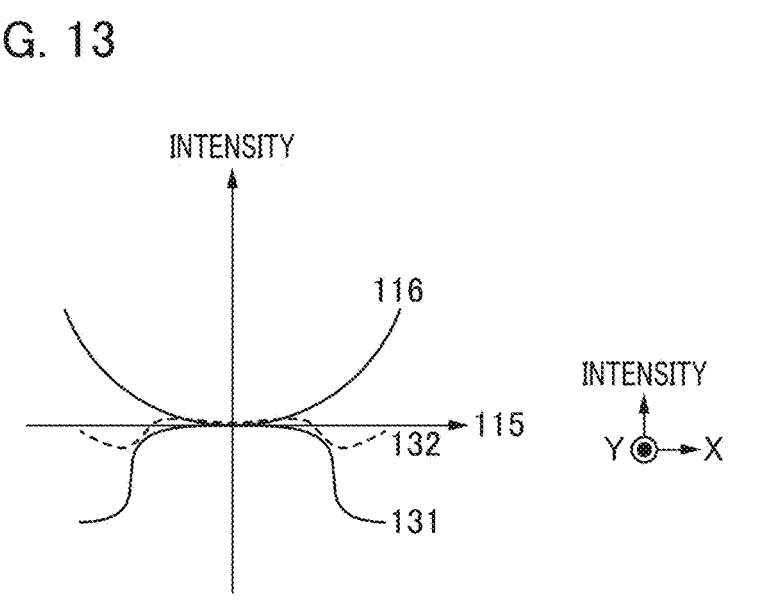
FIG. 13 is a diagram illustrating an impact of an optical filter on an illuminance distribution on the surface to be illuminated.

FIG. 13 is a diagram illustrating the effect of correcting the illuminance distribution on the surface to be illuminated 110 upon use of an optical filter 121, which shows the illuminance distribution at the X cross-section 115 of the surface to be illuminated 110. Since a light-shielding member is provided at the periphery of each of the filter patterns 1b, 1d, 2a, 2e, 4a, 4e, 5b, and 5d in the optical filter 121, illuminance of light transmitted through these filter patterns decreases at the periphery of the surface to be illuminated 110 as shown in the illuminance distribution 131. Thus, the illuminance distribution at the X cross-section 115 of the surface to be illuminated 110 is a superimposition of the illuminance distribution 116 prior to correction and the illuminance distribution 131 obtained by correction, resulting in obtaining an illuminance distribution as shown by the illuminance distribution 132 after correction. In this manner, the illuminance distribution at the X cross-section 115 of the surface to be illuminated 110 shifts from the illuminance distribution 116 prior to correction to the illuminance distribution 132 after correction, so that a variance in illuminance within an illumination area can be reduced. Thus, illuminance uniformity on the surface to be illuminated 110 can to be improved.

Figure 14A:
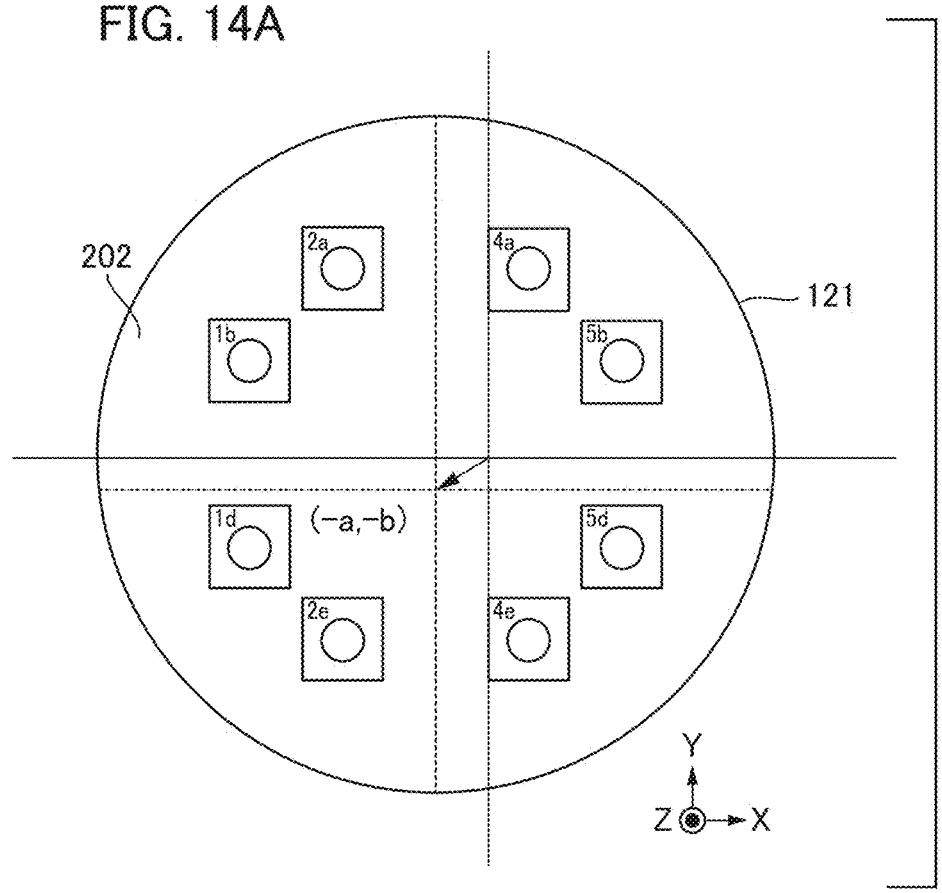
FIG. 14A is a diagram illustrating optical filters in a second embodiment.

Next, a description will be given of the effect of reducing the affection caused by an attachment error of the optical filter 121 according to the present embodiment. FIG. 14A is a diagram illustrating the optical filter 202 in the present embodiment. The image on the light-emitting end surface 106a of the rod-type optical integrator 106 to be formed by the filter patterns 1b, 1d, 5b, and 5d is obtained by the fact that the number of times of reflections within the rod-type optical integrator 106 in the X axis direction is two times and the number of times of reflections within the rod-type optical integrator 106 in the Y axis direction is one time. Thus, the orientation of the filter patterns is in an inverted relationship with the orientation of the image on the light-emitting end surface 106a of the rod-type optical integrator 106 in the X axis direction.

Furthermore, the light-emitting end surface 106a of the rod-type optical integrator 106 and the surface to be illuminated 110 are in a conjugate relationship corresponding to one-time imaging by the light focusing optical systems 107 and 109, and thus, the orientation of the image is inverted. Thus, the orientation of the filter patterns is in an inverted relationship with the orientation of the image on the surface to be illuminated 110 in the Y axis direction.

Next, the image on the light-emitting end surface 106a of the rod-type optical integrator 106 to be formed by the filter patterns 2a, 2e, 4a, and 4e is obtained by the fact that the number of times of reflections within the rod-type optical integrator 106 in the X axis direction is one time and the number of times of reflections within the rod-type optical integrator 106 in the Y axis direction is two times. Thus, the orientation of the filter patterns is in an inverted relationship with the orientation of the image on the light-emitting end surface 106a of the rod-type optical integrator 106 in the Y axis direction.

Furthermore, the light-emitting end surface 106a of the rod-type optical integrator 106 and the surface to be illuminated 110 are in a conjugate relationship corresponding to one-time imaging by the light focusing optical systems 107 and 109, and thus, the orientation of the image is inverted. Thus, the orientation of the filter patterns is in an inverted relationship with the orientation of the image on the surface to be illuminated 110 in the X axis direction. Here, consider the case where the attachment position of the optical filter 121 is displaced (−a, −b) from the center of the optical axis.

Figure 14B:
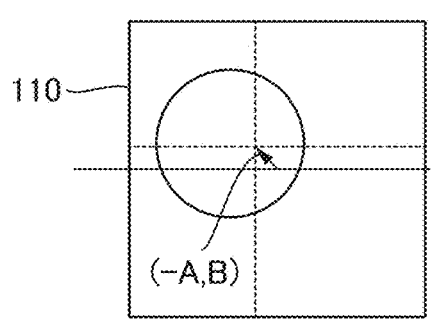
FIG. 14B is a diagram illustrating an image of the surface to be illuminated formed by a filter pattern.
Figure 14C:
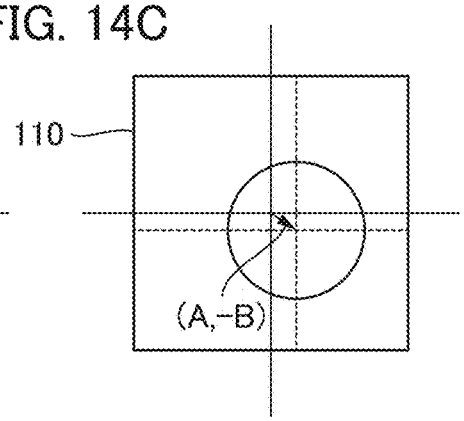
FIG. 14C is a diagram illustrating an image of the surface to be illuminated formed by a filter pattern.

FIG. 14B is a diagram illustrating the image on the surface to be illuminated 110 to be formed by the filter patterns 1b, 1d, 5b, and 5d. These filter patterns are in an inverted relationship with the orientation of the image on the surface to be illuminated 110 in the Y axis direction. Thus, the position of the image on the surface to be illuminated 110 becomes (−A, B) because it is reversely displaced in the Y axis direction from the attachment error of the optical filter 121. FIG. 14C is a diagram illustrating the image on the surface to be illuminated 110 to be formed by the filter patterns 2a, 2e, 4a, and 4e. The orientation of these filter patterns is in an inverted relationship with the orientation of the image on the surface to be illuminated 110 in the X axis direction. Thus, the position of the image on the surface to be illuminated 110 becomes (A, −B) because it is reversely displaced in the X axis direction from the attachment error of the optical filter 121.

Figure 14D:
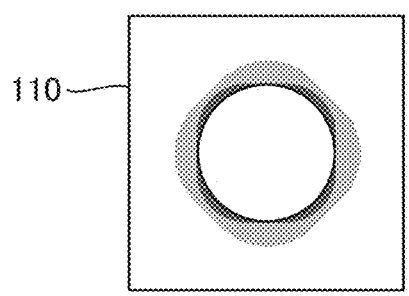
FIG. 14D is a diagram illustrating a composite image of FIG. 14B and FIG. 14C on the surface to be illuminated in the second embodiment.

FIG. 14D is a diagram illustrating the image on the surface to be illuminated 110 to be formed by the embodiment of the present invention, which is provided as a composite image of FIG. 14B and FIG. 14C. If the attachment position of the optical filter 121 is displaced from the optical axis, the image formed by the filter patterns 1b, 1d, 5b, and 5d and the image formed by the filter patterns 2a, 2e, 4a, and 4e are displaced from each other in different directions. Thus, the center position of the composite image is not displaced although its contour portion is slightly blurred.

Figure 15A:
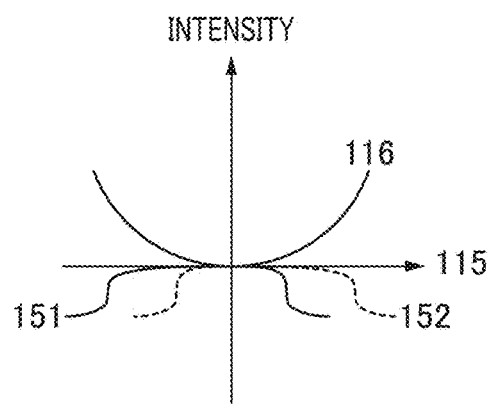
FIG. 15A is a diagram illustrating an illuminance distribution at the X cross-section of the surface to be illuminated.
Figure 15B:
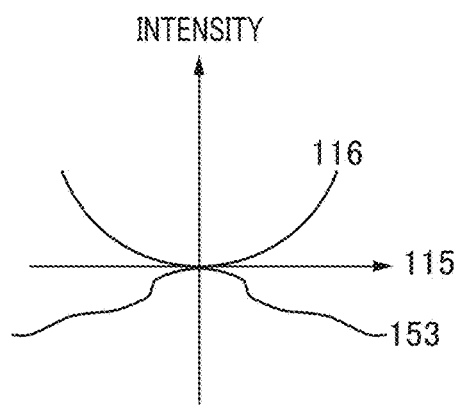
FIG. 15B is a diagram illustrating the effect of correcting an illuminance distribution.
Figure 15C:
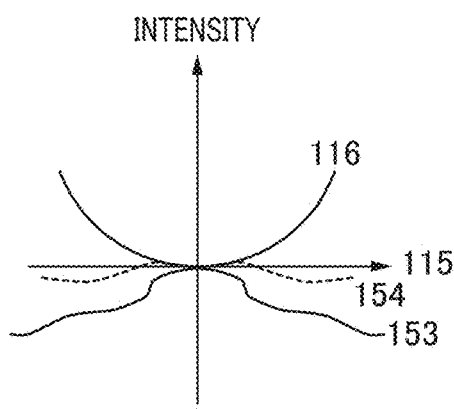
FIG. 15C is a diagram illustrating an illuminance distribution obtained by superimposition of the illuminance distribution prior to correction and the illuminance distribution after correction.

FIGS. 15A to 15C are diagrams illustrating the effect of correcting the illuminance distribution on the surface to be illuminated 110 if the attachment center position of the optical filter 121 is displaced (−a, −b) from the center of the optical axis, which shows the illuminance distribution at the X cross-section 115 of the surface to be illuminated 110. Since a light-shielding member is provided at the periphery of each of the filter patterns 1b, 1d, 5b, and 5d in the optical filter 121, illuminance of light transmitted through these filter patterns decreases at the periphery of the surface to be illuminated 110 as shown in the illuminance distribution 151 (FIG. 15A). Furthermore, since the central portion of the optical filter 121 is displaced from the optical axis as shown in FIG. 14B, the central portion of the optical filter 121 is displaced toward the negative side in the X axis direction on the surface to be illuminated 110.

Since a light-shielding member is also provided at the periphery of each of the filter patterns 2a, 2e, 4a, and 4e in the optical filter 121, illuminance of light transmitted through these filter patterns decreases at the periphery of the surface to be illuminated 110 as shown in the illuminance distribution 152. Furthermore, since the central portion of the optical filter 121 is displaced from the optical axis as shown in FIG. 14C, the central portion of the optical filter 121 is displaced toward the positive side in the X axis direction on the surface to be illuminated 110. The illuminance distribution at the X cross-section 115 of the surface to be illuminated 110 to be formed by the optical filter 121 is affected by a superimposition of the illuminance distribution 151 and the illuminance distribution 152, resulting in obtaining the effect of correcting an illuminance distribution as shown by the illuminance distribution 153 in FIG. 15B.

Thus, the illuminance distribution at the X cross-section 115 of the surface to be illuminated 110 is a superimposition of the illuminance distribution 116 prior to correction and the illuminance distribution 153 obtained by correction, resulting in obtaining an illuminance distribution as shown by the illuminance distribution 154 (FIG. 15C). In this manner, the illuminance distribution at the X cross-section 115 of the surface to be illuminated 110 shifts from the illuminance distribution 116 prior to correction to the illuminance distribution 154 after correction, so that a variance in illuminance within an illumination area can be reduced. Thus, illuminance uniformity on the surface to be illuminated can to be improved. In the present embodiment, a description has been given of the case where all the filter patterns in the optical filter 121 have the same light-shielding circular shape so as to control the amount of light. Thus, the illuminance distributions 132 and 153 obtained by correction at the X cross-section 115 of the surface to be illuminated 110 are not in a secondary shape, so that the illuminance distribution after correction is not completely uniform.

However, an image on the surface to be illuminated 110 is blurred by displacing the position at which the optical filter 121 is disposed from a plane conjugated to the light-emitting end surface 106a of the rod-type optical integrator 106 toward the optical axis direction, and thus, the correcting effect can be smoothed. The illuminance distribution on the surface to be illuminated 110 can also be better organized.

Third Embodiment

Figure 16:
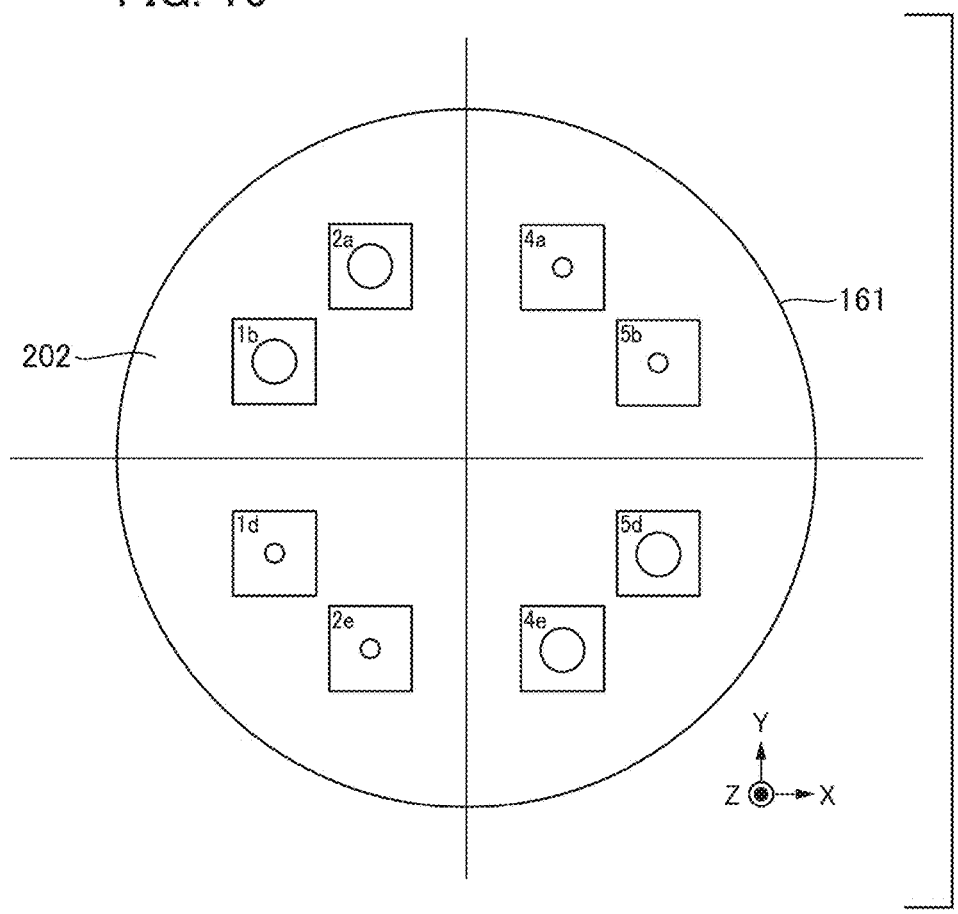
FIG. 16 is a diagram illustrating optical filters in the case where the shape of the light-shielding member in a third embodiment is deformed.

In the present embodiment, a description will be given of the case where the illuminance distribution on the surface to be illuminated 110 is better organized by changing the shapes of the light-shielding members provided in the filter patterns for each filter pattern. First, as shown in FIG. 16, each of the filter patterns 1b, 2a, 4e, and 5d in the optical filter 202 is provided with a light-shielding member having the same shape as that of the optical filter 121. Each of the filter patterns 1d, 2e, 4a, and 5b is provided with a pattern having a narrower light-transmitting area than that of the light-shielding member provided in each of the filter patterns 1b, 2a, 4e, and 5d. The optical filter provided with such filter patterns is defined as 161.

Figure 17A:
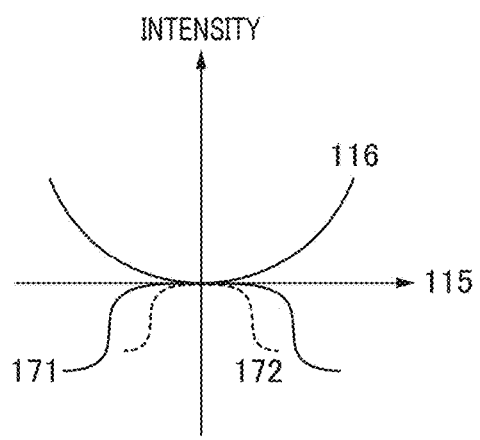
FIG. 17A is a diagram illustrating an illuminance distribution of the beam of light transmitted through the filter pattern at the X cross-section of the surface to be illuminated.

A light-shielding member is provided at the periphery of each of the filter patterns 1b, 2a, 4e, and 5d in the optical filter 161. Thus, the illuminance distribution of light transmitted through these filter patterns at the X cross-section 115 of the surface to be illuminated 110 exhibits a decrease in illuminance at the periphery of the surface to be illuminated 110 as shown in an illuminance distribution 171 in FIG. 17A. A light-shielding member is also provided at the periphery of each of the filter patterns 1d, 2e, 4a, and 5b in the optical filter 161. Thus, the illuminance distribution of light transmitted through these filter patterns at the X cross-section 115 of the surface to be illuminated 110 exhibits a decrease in illuminance at the periphery of the surface to be illuminated 110. Furthermore, since the filter patterns 1d, 2e, 4a, and 5b have narrower light-transmitting areas than those of the filter patterns 1b, 2a, 4e, and 5d, the illuminance distribution at the X cross-section 115 of the surface to be illuminated 110 has the narrowed high illuminance area as shown in 172.

Figure 17B:
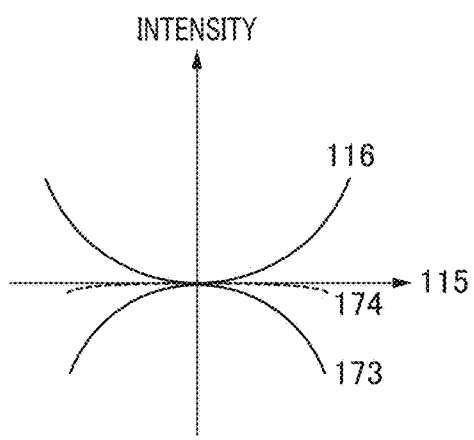
FIG. 17B is a diagram illustrating the effect of correcting the illuminance distribution at the X cross-section of the surface to be illuminated formed by an optical filter.

The illuminance distribution at the X cross-section 115 of the surface to be illuminated 110 to be formed by the optical filter 161 is affected by a superimposition of the illuminance distributions 171 and 172 obtained by correction, resulting in obtaining the effect of correcting an illuminance distribution closer to a secondary shape such as an illuminance distribution 173 in FIG. 17B. Thus, the illuminance distribution at the X cross-section 115 of the surface to be illuminated 110 is a superimposition of the illuminance distribution 116 prior to correction and the illuminance distribution 173 obtained by correction, resulting in obtaining an illuminance distribution as shown by an illuminance distribution 174. In other words, illuminance uniformity can to be improved greater than the illuminance correcting effects 132 and 153 obtained when all the light-shielding members provided in the filter patterns have the same shape.

In the present embodiment, a description has been given of the example in which the shapes of the light-shielding members provided in the filter patterns are changed for each filter pattern (deformable light-shielding members). However, in order to obtain a desired effect of correcting an illuminance distribution by taking into consideration of the illuminance correcting effect of each filter pattern on the surface to be illuminated 110, the transmittance of each light-shielding member may also be changed.

According to the first, second, and third embodiments of the present invention, a description has been given of the case where the filter patterns are disposed at positions of 1b, 1d, 5b, 5d, 2a, 2e, 4a, and 4e. The filter patterns 1b, 1d, 5b, and 5d in the first, second, and third embodiments correspond to the filter patterns of which the number of times of reflections within the rod-type optical integrator 106 in the X axis direction is two times and the number of times of reflections within the rod-type optical integrator 106 in the Y axis direction is one time. The filter patterns 2a, 2e, 4a, and 4e correspond to the filter patterns of which the number of times of reflections within the rod-type optical integrator 106 in the X axis direction is one time and the number of times of reflections within the rod-type optical integrator 106 in the Y axis direction is two times. However, as an implementation method for expecting the effect of the present invention, the number of times of reflections within the rod-type optical integrator 106 in the X axis direction are not necessarily one time and two times and the number of times of reflections within the rod-type optical integrator 106 in the Y axis direction are not necessarily one time and two times. Specifically, the combination of the number of times of reflections in the X axis direction and the number of times of reflections in the Y axis direction is not necessarily the same.

Figure 18:
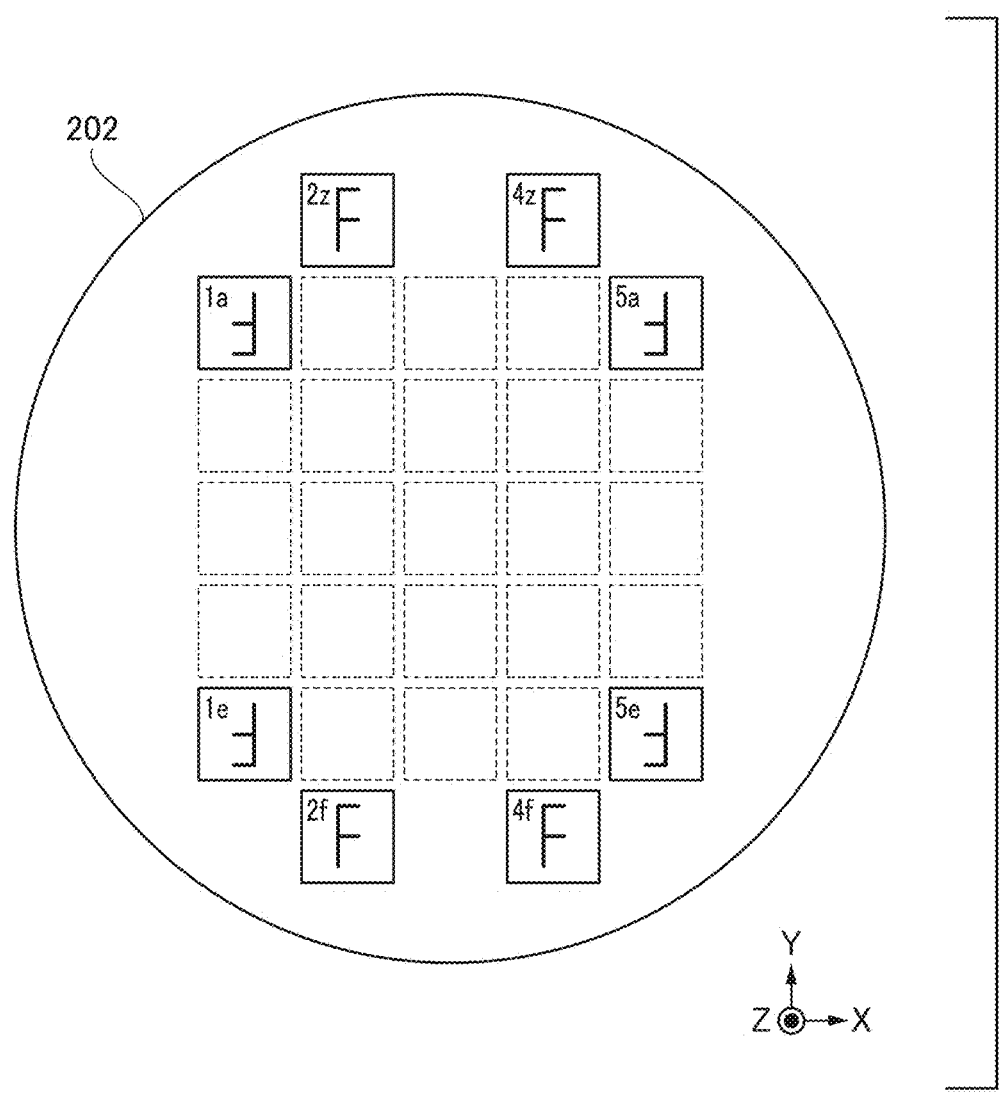
FIG. 18 is a diagram illustrating optical filters with adjusting units provided at positions each having a different number of times of reflections.

FIG. 18 is a diagram illustrating the case where the filter patterns are disposed at positions of 1a, 1e, 2z, 2f, 4z, 4f, 5a, and 5e. The filter patterns 1a, 1e, 5a, and 5e correspond to the filter patterns of which the number of times of reflections within the rod-type optical integrator 106 in the X axis direction is two times and the number of times of reflections within the rod-type optical integrator 106 in the Y axis direction is two times. The filter patterns 2z, 2f, 4z, and 4f correspond to the filter patterns of which the number of times of reflections within the rod-type optical integrator 106 in the X axis direction is one time and the number of times of reflections within the rod-type optical integrator 106 in the Y axis direction is three times.

As shown in FIG. 18, the image of the filter patterns 1a, 1e, 5a, and 5e is in mirror image relationship with the image of the filter patterns 2z, 2f, 4z, and 4f. In other words, the effect of the present invention can be expected provided that the filter patterns include both the filter patterns of which the number of times of reflections within the rod-type optical integrator 106 in the X axis direction are an odd number of times and an even number of times and both the filter patterns of which the number of times of reflections within the rod-type optical integrator 106 in the Y axis direction are an odd number of times and an even number of times.

Article Manufacturing Method

An article manufacturing method according to an embodiment of the present invention is preferred in manufacturing an article such as a micro device such as a semiconductor device or the like, an element or the like having a micro-structure, or the like. The article manufacturing method may include a step of forming a latent image pattern on an object (e.g., exposure process) using the aforementioned exposure apparatus; and a step of developing the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-078857 filed on Apr. 8, 2015, which is hereby incorporated by reference herein in its entirety.

What is claimed is:

1. An illumination optical apparatus for illuminating a surface to be illuminated with light from a light source, the illumination optical apparatus comprising:

an optical integrator configured to form a plurality of secondary light sources by causing an incident light to be reflected at an inner surface thereof;

a light amount adjuster configured to have a plurality of light amount adjusting elements for adjusting a light amount of the secondary light source; and a condensor optical system configured such that the light amount adjuster is in a conjugate relationship with a light-emitting end surface of the optical integrator, wherein the light amount adjusting elements are located at positions, which correspond to a secondary light source which is formed by an odd number of times of reflections in a first direction by the optical integrator and a secondary light source which is formed by an even number of times of reflections in the first direction by the optical integrator and a secondary light source which is formed by an odd number of times of reflections in a second direction different from the first direction by the optical integrator and a secondary light source which is formed by an even number of times of reflections in the second direction by the optical integrator, wherein the light amount adjusting element is not located at a position which corresponds to the secondary light source which is formed by no reflection in the optical integrator.

2. The illumination optical apparatus according to claim 1, wherein the light amount adjusting elements are located at positions of point symmetry.

3. The illumination optical apparatus according to claim 1, wherein the light amount adjusting element has a light-shielding member having a different shape depending on its position.

4. The illumination optical apparatus according to claim 1, wherein the number of the light amount adjusting elements corresponding to the secondary light source which is formed by the odd number of times of reflections by the optical integrator is the same as the number of the light amount adjusting elements corresponding to the secondary light source which is formed by the even number of times of reflections by the optical integrator.

5. The illumination optical apparatus according to claim 1, wherein the optical integrator is a rod-type optical integrator.

6. The illumination optical apparatus according to claim 1, wherein the light amount adjuster has only the first light amount adjusting element which are located at a position, which corresponds to the secondary light source which is formed by the odd number of times of reflections in the first direction and the even number of times of reflections in the second direction by the optical integrator and the second light amount adjusting element which are located at a position, which corresponds to a secondary light source which is formed by the even number of times of reflections in the first direction and the odd number of times of reflections in the second direction by the optical integrator.

7. The illumination optical apparatus according to claim 6, wherein the light amount adjuster has the first light amount adjusting elements located at positions of point symmetry and the second light amount adjusting elements located at positions of point symmetry.

8. An exposure apparatus for transferring an image of a pattern formed on an original to a substrate, comprising:

an illumination optical apparatus that illuminates a surface to be illuminated of the original with light from a light source and comprises:

an optical integrator configured to form a plurality of secondary light sources by causing an incident light to be reflected at an inner surface thereof;

a light amount adjuster configured to have a plurality of light amount adjusting elements for adjusting a light amount of the secondary light source; and a condenser optical system configured such that the light amount adjuster is in a conjugate relationship with a light-emitting end surface of the optical integrator, wherein the light amount adjusting elements are located at positions, which correspond to a secondary light source which is formed by an odd number of times of reflections in a first direction by the optical integrator and a secondary light source which is formed by an even number of times of reflections in the first direction by the optical integrator and a secondary light source which is formed by an odd number of times of reflections in a second direction different from the first direction by the optical integrator and a secondary light source which is formed by an even number of times of reflections in the second direction by the optical integrator, wherein the light amount adjusting element is not located at a position which corresponds to the secondary light source which is formed by no reflection in the optical integrator.

9. A method for manufacturing a device, the method comprising steps of:

exposing a substrate using an exposure apparatus; and developing the substrate exposed in the exposing, wherein the exposure apparatus is an exposure apparatus that transfers an image of a pattern formed on an original to a substrate, and comprises an illumination optical apparatus, wherein the illumination optical apparatus is an illumination optical apparatus that illuminates the surface to be illuminated of the original with light from a light source and comprises:

an optical integrator configured to form a plurality of secondary light sources by causing an incident light to be reflected at an inner surface thereof;

a light amount adjuster configured to have a plurality of light amount adjusting elements for adjusting a light amount of the secondary light source; and a condenser optical system configured such that the light amount adjuster is in a conjugate relationship with a light-emitting end surface of the optical integrator, wherein the light amount adjusting elements are located at positions, which correspond to a secondary light source which is formed by an odd number of times of reflections in a first direction by the optical integrator and a secondary light source which is formed by an even number of times of reflections in the first direction by the optical integrator and a secondary light source which is formed by an odd number of times of reflections in a second direction different from the first direction by the optical integrator and a secondary light source which is formed by an even number of times of reflections in the second direction by the optical integrator, wherein the light amount adjusting element is not located at a position which corresponds to the secondary light source which is formed by no reflection in the optical integrator.

* * * * *